(12) United States Patent
Shintani et al.

(10) Patent No.: US 6,583,677 B2
(45) Date of Patent: Jun. 24, 2003

(54) OSCILLATOR AND AN OSCILLATOR CHARACTERISTIC ADJUSTMENT METHOD

(75) Inventors: Jun Shintani, Yao (JP); Terukazu Otsuki, Ikoma-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/974,791

(22) Filed: Oct. 12, 2001

(65) Prior Publication Data

US 2002/0044022 A1 Apr. 18, 2002

(30) Foreign Application Priority Data

Oct. 12, 2000 (JP) ........................................ 2000-311612

(51) Int. Cl.[7] .............................. H03L 7/00; H03B 5/18
(52) U.S. Cl. .............................. 331/107 SL; 331/36 L; 331/177 R; 331/96; 331/107 DP
(58) Field of Search ................ 331/107 SL, 107 DP, 331/99, 96, 177 R, 36 L; 333/246

(56) References Cited

U.S. PATENT DOCUMENTS 5,087,896 A * 2/1992 Wen et al. ..................... 29/593

FOREIGN PATENT DOCUMENTS

| JP | A6-13807 | 1/1994 |
|----|----------|--------|
| JP | 2531000 | 6/1996 |
| JP | A9-15373 | 1/1997 |
| JP | 2662748 | 6/1997 |
| JP | 11068459 A * | 3/1999 |
| JP | A11-330853 | 11/1999 |
| JP | A2000-307345 | 11/2000 |
| JP | A2001-7642 | 1/2001 |

* cited by examiner

*Primary Examiner*—Arnold Kinkead
(74) *Attorney, Agent, or Firm*—Birch, Stewart, Kolasch & Birch, LLP

(57) ABSTRACT

An oscillator including a circuit board having a dielectric layer therein; an oscillator circuit comprising its components and an inductor element, the components being mounted on a front surface of the circuit board and at least a part of the inductor element being internally disposed in the dielectric layer; and a back conductor provided on a back surface of the circuit board; wherein the back conductor has two or more slits or pinholes through which a laser beam is passed for partially cutting the dielectric layer together with the internally disposed inductor element at plural sites for adjustment of an oscillation characteristic.

11 Claims, 10 Drawing Sheets

OSCILLATOR AND AN OSCILLATOR CHARACTERISTIC ADJUSTMENT METHOD

CROSS-REFERENCE TO RELATED APPLICATION

This application is related to Japanese patent application No. 2000-311612, whose priority is claimed under 35 USC §119, the disclosure of which is incorporated by reference in its entirety.

BACKGROUND OF THE INVENTION

1. Field of the Invention

The present invention relates to an oscillator and a method for adjusting oscillation characteristics of the oscillator. More specifically, the present invention relates to a small oscillator used in mobile telephones, mobile data terminals, wireless LAN transmitter/receivers, satellite communications terminals, GPS receivers and other types of wireless communication devices operating at a high frequency band, and to a method for adjusting the oscillation characteristics of the oscillator. An oscillator according to this invention is well suited to reducing the size of a module that is a major component of the oscillator used particularly in a high frequency band operating at hundreds of megahertz and higher.

2. Description of Related Art

As terminal devices for high frequency communication systems, such as mobile telephones, have gotten smaller, so have oscillation circuit modules, such as voltage control oscillators (VCO), which are one kind of high frequency components used in such terminal devices.

The characteristics of individual components and variations in wiring pattern dimensions in substrates cannot be ignored in such small oscillation modules for high frequency applications, particularly at frequencies of hundreds of megahertz and higher. It is therefore necessary in practice to adjust each individual module so that the oscillation frequency, for example, is within a specific design range.

One method used for this adjustment as taught in Japanese Unexamined Patent Publication HEI6 (1994)-13807 is to adjust an inductor part of an oscillation circuit by changing the length and/or width of a conductor pattern. This is accomplished by cutting a part of a circuit pattern formed on a component mounting surface of a circuit board by mechanical means, such as a sandblasting machine, or optical means, such as a laser beam. Other methods seeking to achieve an even smaller module by means of a multilayer circuit board provide a part of an inductor (see Japanese Patent No. 2662748) or capacitor (see Japanese Patent No. 2531000) of the oscillation circuit in the circuit board layers.

FIGS. 10 and 11 show an exemplary oscillator in which an inductor part of an oscillator is drawn to a circuit board surface. As shown in FIG. 10, a back ground conductor 22, an internal ground conductor 23 and an inductor conductor 24 of a strip line between the conductors 22 and 23 are formed within a printed circuit board 21, forming a tri-plate structure. A part 24a of the strip line inductor conductor is connected through a through hole 25 to a conductor pad 24b mounted on the substrate surface. The electrical length of the inductor can then be changed by appropriately trimming this surface conductor pad 24b on the substrate surface as shown at notches 26 in FIG. 11, thereby adjusting inductance L to vary oscillator characteristics such as oscillation frequency.

Another adjustment method is illustrated in FIG. 12. As shown in this section view of an oscillator, a capacitor of the oscillator is formed inside a substrate, and one electrode of the capacitor electrode disposed on the substrate surface is trimmed to adjust capacitance as a means of adjusting oscillator characteristics. In this example, an inductor of a resonance circuit is incorporated as a strip line 24 of the tri-plate structure inside a printed circuit board 21 as in the above example, and one end of the inductor is exposed via a through hole 25 on to the substrate surface as a surface electrode 28. That is, a capacitor 27 of a resonance circuit parallel-connected to the inductor is mounted within the circuit board with the surface electrode 28 opposed to the internal ground conductor 23 with the intervention of the dielectric circuit board. The surface electrode 28 is trimmed to adjust the electrode surface area, and thereby adjust capacitance, that is, adjust the oscillator.

In the above-described prior-art examples, while a part of the circuit is formed inside the circuit board so as to reduce device dimensions, both of the methods also expose a part of the internal conductor pattern on the component mounting surface of the circuit board so that the exposed part (part 24b in FIG. 10 and part 28 in FIG. 12) is trimmed, to adjust oscillator module characteristics. This method of internalizing a part of the circuit as a means of reducing size is therefore the same as methods in which parts are not internalized in that a trimming pad occupies a certain amount of area on the component mounting surface.

A metal shield cap covering the component mounting surface is provided for most such modules to protect the mounted components and prevent electromagnetic interference with neighboring parts. This shield cap can be mounted either before or after adjusting the oscillator. When the shield cap is installed after trimming a circuit component on the component mounting surface of the circuit board to adjust the oscillator, the adjustment must be accomplished to anticipate any shift in characteristics resulting from the later addition of the shield cap. If the shield cap is installed before the adjustment, a laser can be used for trimming through a trimming slit or hole provided in the shield cap, and the trimming slit or hole is then sealed with a conductive sealant.

In the former method, trimming must allow for any shift in the oscillator frequency or other module characteristics resulting from the addition of the shield cap. As noted above, however, since variations in characteristics of individual modules are great, the adjustment is not possible with a uniform offset, and the precise adjustment is not possible with this method. In the latter method, dust and debris from the trimmed part become trapped inside the shield cap because trimming is accomplished after the shield cap is mounted. Such dust and debris can easily adhere to surrounding parts, resulting in a possible loss of reliability.

One possible method of resolving this problem is to draw an internal conductor to the back side of a circuit board for trimming. In this case, however, a trimming pad must be provided, and this occupies some area on the back of the circuit board. This makes it difficult to shield the back of a module. A shield cap such as provided on the front surface of the circuit board must therefore be provided. This method is therefore not practical for applications seeking to downsize the module.

Another oscillator adjustment method proposing a solution to this problem is taught in Japanese Unexamined Patent Publication HEI9 (1997)-153737. This method accomplishes laser trimming perpendicular from the back of a circuit board to the inside to adjust electrode area of a multilayer internal capacitor.

FIG. 13 is a section view of a module in this method. In this module a capacitor 27 of a resonance circuit is internalized in a circuit board by stacking electrodes 27a and 27b with a dielectric layer of the circuit board therebetween. As indicated by an arrow 28 in FIG. 14, laser trimming perpendicular to and from the back of the module adjusts the area of the electrodes 27a and 27b of the internal capacitor 27, and thus adjusts the module.

While this method solves the surface area problem described above, an electrode structure of a capacitor must be a multilayer structure comprising at least three or four layers in order to achieve a sufficient capacitance adjustment range. This results in a multilayer circuit board, increasing circuit board thickness and cost.

The inventors of the present invention have been provided another solution to the above-mentioned problems as disclosed in Japanese Unexamined Patent Publication No. 2001-007642 (hereinafter it is referred to as a preceding application). In this method, a part of an inductor element of a resonance circuit is disposed within a dielectric layer of a substrate and the internally disposed inductor element is cut simultaneously with the dielectric layer by laser beam irradiation from the back side of the substrate to change the length and/or width of the inductor element pattern, thereby adjusting the inductor of the oscillation circuit.

The preceding application will be explained with reference to FIG. 15 illustrating its major structure. According to the preceding application, a circuit board including a dielectric layer therein is formed in a four-layered structure of a component mounting conductor pattern surface (layer) 32, an internal ground conductor layer 33, a conductor pattern layer 34 and a back ground conductor layer 35. The internal conductor pattern layer 34 serves as an internal strip line conductor pattern 34 and sandwiched between the internal ground conductor layer 33 and the back ground conductor layer 35 to form an inductor of an oscillator in a tri-plate structure.

The internal conductor pattern layer 34 is electrically connected through a via member 36 to a conductor pattern layer 32 on the substrate surface. The surface conductor pattern layer 32 is connected to another oscillator component 31 mounted on the substrate surface. Further, a metal shield cap 38 is provided on the substrate surface, and the back ground conductor layer 35 is provided with a trimming slit 40. A laser beam 41 is irradiated through the slit 40 to simultaneously cut the dielectric layer and the internal conductor pattern layer to change the electrical length of the inductor, thereby adjusting inductance L, i.e., oscillation characteristics such as oscillation frequency.

The preceding application can achieve downsizing of the module. However, the dielectric layer of glass epoxy and the internal conductor pattern layer of Cu or the like are greatly different in laser beam absorption rate. Glass epoxy and Cu show the absorption rate of several tens % and about 5%, respectively, to a YAG laser beam of 1.06 $\mu$m wavelength. Therefore it is difficult to adjust the laser beam to an optimum intensity for both of the materials.

Where the oscillation characteristic needs to be greatly varied to reach the desired characteristic by trimming only one part, the amount of the trimming part increases and the width of the part of the inductor is reduced, which raises the resistance at this point and reduces Q value of the inductance L, resulting in deterioration of module performance such as noise characteristics.

Further, trimming in a great amount also takes time. Accordingly, the above-mentioned adjustment method is not sufficient in view of module performance and reliability.

SUMMARY OF THE INVENTION

With consideration for the above problems, an object of the present invention is therefore to provide a compact, high performance, high reliability oscillator (module) having a structure which allows an internal conductor pattern primarily of a resonance circuit inductor to be trimmed directly from the back of a circuit board. A further object of the invention is to provide an adjustment method for the oscillator (module).

To achieve the above objects, the present invention provides an oscillator comprising: a circuit board having a dielectric layer therein; an oscillator circuit comprising its components and an inductor element, the components being mounted on a front surface of the circuit board and at least a part of the inductor element being internally disposed in the dielectric layer; and a back conductor provided on a back surface of the circuit board; wherein the back conductor has two or more slits or pinholes through which a laser beam is passed for partially cutting the dielectric layer together with the internally disposed inductor element at plural sites for adjustment of an oscillation characteristic.

In other words, according to the present invention, the slits or pinholes are provided on the back conductor on the back surface of the circuit board and the laser beam is passed through the slits or pinholes to partially cut (trim) the internally disposed inductor element together with the dielectric layer sandwiched between the back conductor and the internal conductor (a part of the internally disposed inductor element) at plural sites, thereby changing the electrical length of the pattern to adjust the oscillation characteristics to a desired level. Upon changing the electrical length, the inductor element is cut at the plural sites, which prevents the width of the inductor at a certain site from being extremely reduced and thus inhibits decrease in Q value of the inductance L.

Other objects and attainments together with a fuller understanding of the invention will become apparent and appreciated by referring to the following description and claims taken in conjunction with the accompanying drawings.

DESCRIPTION OF THE PREFERRED EMBODIMENTS

Figure 1:
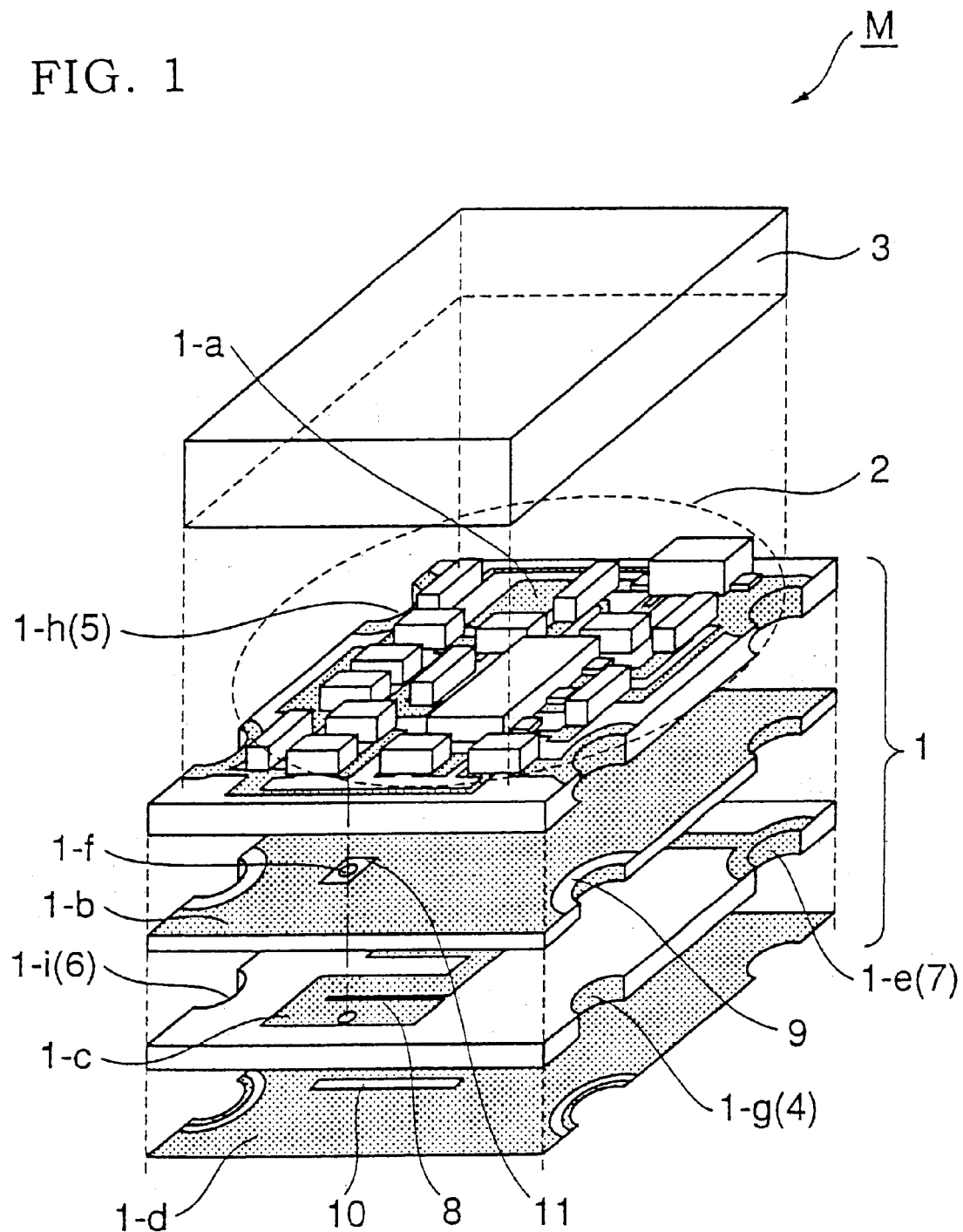
FIG. 1 is a partially exploded perspective view of a voltage control oscillator in accordance with Embodiment 1 of the present invention.

According to the oscillator of the present invention, the inductor element comprises an internally disposed strip line including a detour path and a short path shorting both ends of the detour path, the short path being cut by the laser beam in at least one site of the plural sites.

That is, according to the present invention, the short path forming a pair with the detour path of the internal strip line comprising the inductor element is trimmed so that the electrical length of the inductor element can be greatly varied in steps regardless of the length of the trimmed part. Thus, the inductance L can be greatly changed to the desired oscillation characteristic with a shorter trimming time.

Further, according to the oscillator of the present invention, the inductor element further includes an internally disposed conductor pattern to be cut by the laser beam in at least one site of the plural sites in addition to the short path, the internally disposed conductor pattern allowing the oscillation characteristic to be continuously varied depending on which part is cut.

That is, in addition to the detour path and the short path comprising the internal strip line of the inductor, the oscillator of the present invention is provided with the internal conductor pattern, which allows the oscillation characteristics to be continuously varied depending on which part is cut, as a trimming part capable of continuously changing the inductance L depending on a trimming amount.

According to this structure, a great or small difference from the desired oscillation characteristic can be adjusted. Thus, a compact, high performance, precisely adjusted oscillator is obtained.

Further, according to the oscillator of the present invention, a variation amount of the oscillation characteristic caused by cutting the internally disposed conductor pattern which allows the oscillation characteristic to be continuously varied depending on which part is cut is greater than a variation amount of the oscillation characteristic caused by cutting the short path.

That is, where the internal strip line inductor element includes the detour path, the short path, as well as the internal conductor pattern which allows the electrical length to be continuously varied depending on the trimming amount, a variation amount of the inductance L continuously changed depending on the trimming amount of the internal conductor pattern becomes greater than a variation amount of the inductance L greatly changed by cutting the short path. Accordingly, by settling the position of the trimming parts, the corresponding position of the slits or pinholes, and the positions of the detour path and the short path, the inductance L can be adjusted to every value in the adjustment range, i.e., fine adjustment and rough adjustment within the entire adjustment range is allowed. Thus, a compact, high performance, precisely adjusted oscillator is obtained.

Further, the present invention provides an oscillator comprising: a circuit board having a dielectric layer therein; an oscillator circuit comprising its components and an inductor element, the components being mounted on a front surface of the circuit board and at least a part of the inductor element being internally disposed in the dielectric layer; and a back conductor provided on a back surface of the circuit board; wherein the back conductor has two or more slits or pinholes through which a laser beam is passed for partially cutting the dielectric layer together with the internally disposed inductor element at plural sites for adjustment of an oscillation characteristic, the inductor element is comprised of an internally disposed strip line including a detour path and a short path for shorting both ends of the detour path, and the short path is cut by the laser beam passing through the slits or pinholes to adjust the oscillation characteristic.

Since the short path forming a pair with the detour path of the internal strip line of the inductor element is cut, the electrical length of the inductor element can be greatly varied in steps regardless of the length of the trimmed part. Thus, the inductance L can be greatly changed to the desired oscillation characteristic in a shorter trimming time.

The present invention further provides a method for adjusting an oscillation characteristic of an oscillator comprising a circuit board having a dielectric layer therein; an oscillator circuit comprising its components and an inductor element, the components being mounted on a front surface of the circuit board and at least a part of the inductor element being internally disposed in the dielectric layer; and a back conductor being provided on a back surface of the circuit board, wherein the oscillation characteristic is adjusted by partially cutting the dielectric layer and the internally disposed part of the inductor element at plural sites with a laser beam passing through two or more slits or pinholes formed on the back conductor.

In other words, the slits or pinholes are provided on the back conductor on the back surface of the circuit board and the laser beam is passed through the slits or pinholes to partially cut (trim) the internally disposed inductor element together with the dielectric layer sandwiched between the back conductor and the internal conductor (a part of the internally disposed inductor element) at plural sites, thereby changing the electrical length of the pattern to adjust the oscillation characteristics to a desired level. Upon changing the electrical length, the inductor element is cut at the plural sites, which prevents the width of the inductor at a certain site from being extremely reduced and thus inhibits decrease in Q value of the inductance L.

According to the above-described method of the present invention, an internally disposed strip line including a detour path and a short path for shorting both ends of the detour path is provided as the inductor element, and the oscillation characteristic is adjusted by cutting the short path with the laser beam in at least one site of the plural sites.

That is, according to the present invention, the short path forming a pair with the detour path of the internal strip line comprising the inductor element is trimmed so that the electrical length of the inductor element can be greatly varied in steps regardless of the length of the trimmed part. Thus, the inductance L can be greatly changed. This is effective in the case where the inductance L needs to be greatly changed to the desired characteristic, and the trimming is carried out in a shorter trimming time.

Still according to the above-described method of the present invention, an internally disposed conductor pattern, which allows the oscillation characteristic to be continuously varied depending on which part is cut, is provided in the inductor element, and the oscillation characteristic is adjusted by cutting the internally disposed conductor pattern with the laser beam in at least one site of the plural sites.

That is, in addition to the short path comprising the internal strip line of the inductor together with the detour path, the internal conductor pattern, which allows the oscillation characteristics to be continuously varied depending on which part is cut, is trimmed. According to this structure, a great or small difference from the desired oscillation characteristic can be adjusted, so that the desired oscillation characteristic is precisely obtained from a larger range. Thus, a compact, high performance, precisely adjusted oscillator is obtained.

Further, according to the above-described method of the present invention, a variation amount of the oscillation characteristic caused by cutting the internally disposed conductor pattern which allows the oscillation characteristic to be continuously varied depending on which part is cut is greater than a variation amount of the oscillation characteristic caused by cutting the short path.

That is, where the internal strip line inductor element includes the detour path, the short path, as well as the internal conductor pattern which allows the electrical length to be continuously varied depending on the trimming amount, a variation amount of the inductance L continuously changed depending on the trimming amount of the internal conductor pattern becomes greater than a variation amount of the inductance L greatly changed by cutting the short path. Accordingly, by settling the position of the trimming parts, the corresponding position of the slits or pinholes, and the positions of the detour path and the short path, the inductance L can be adjusted to every value in the adjustment range, i.e., fine adjustment and rough adjustment within the entire adjustment range is allowed. Thus, a compact, high performance, precisely adjusted oscillator is obtained.

According to the above-described method for adjusting an oscillation characteristic of an oscillator comprising a circuit board having a dielectric layer therein; an oscillator circuit comprising its components and an inductor element, the components being mounted on a front surface of the circuit board and at least a part of the inductor element being internally disposed in the dielectric layer; and a back conductor being provided on a back surface of the circuit board, an internally disposed inductor element including a detour path and a short path for shorting both ends of the detour path is provided as the inductor element and the oscillation characteristic is adjusted by cutting the dielectric layer and the short path with a laser beam passing through two or more slits or pinholes formed on the back conductor.

That is, according to the present invention, the short path forming a pair with the detour path of the internal strip line comprising the inductor element is trimmed so that the electrical length of the inductor element can be greatly varied in steps regardless of the length of the trimmed part. Thus, the inductance L can be greatly changed. This is effective in the case where the inductance L needs to be greatly changed to the desired characteristic, and the trimming is carried out in a shorter trimming time.

Further, according to the above-described method for adjusting an oscillation characteristic of an oscillator comprising a circuit board having a dielectric layer therein; an oscillator circuit comprising its components and an inductor element, the components being mounted on a front surface of the circuit board and at least a part of the inductor element being internally disposed in the dielectric layer; and a back conductor being provided on a back surface of the circuit board, the oscillation characteristic is adjusted by cutting the dielectric layer with a first laser beam and then cutting at least a part of the internally disposed inductor element with a second laser beam, the first and second laser beam passing through two or more slits or pinholes formed on the back conductor.

That is, according to the present invention, the first laser beam is irradiated to cut the dielectric layer so that the internal conductor (a part of the internally disposed inductor element) is exposed. Then at the same position, the second laser beam is irradiated to partially cut the internal conductor. Thus, the oscillation characteristic is adjusted. According to this, power of the laser beam is easily adjusted to the optimum level for the dielectric layer and the internally disposed inductor element, respectively, so that the dielectric layer and the internally disposed inductor element can be trimmed and cut more accurately than the simultaneous trimming of them. Therefore, the reliability of the oscillation module itself improves. The first and second laser beams are irradiated under different conditions suitable for materials of the dielectric layer and the internal conductor, respectively, so that the dielectric layer and the internal conductor are precisely trimmed and cut.

Still according to the above-described method of the present invention, at least one of the first and second laser beams is scanned repeatedly while shifting it by a distance smaller than a spot diameter of the laser beam in a substantially perpendicular direction to the scanning direction.

That is, according to the present invention, at least one of the first and second laser beams is scanned repeatedly in the same direction while shifting it by a distance smaller than a spot diameter of the laser beam in a substantially perpendicular direction to the scanning direction. According to this, the dielectric layer and the internal conductor are precisely trimmed with a sufficient width of the trimming part, which improves the reliability of the oscillation module. If the first laser beam is scanned repeatedly through the full length or a certain length of the slit or pinhole and then the second laser beam is scanned, while operating the oscillator for monitoring the characteristic value, through a required length within the slit or pinhole to cut the internal conductor exposed by the first laser beam irradiation until the desired characteristic value is obtained, time required for measurement feedback can be reduced as compared with the case where the function trimming is carried out at the first laser beam irradiation.

PREFERRED EMBODIMENT OF THE INVENTION

The preferred embodiments of the present invention are described below with reference to the accompanying figures.
Embodiment 1

Figure 2:
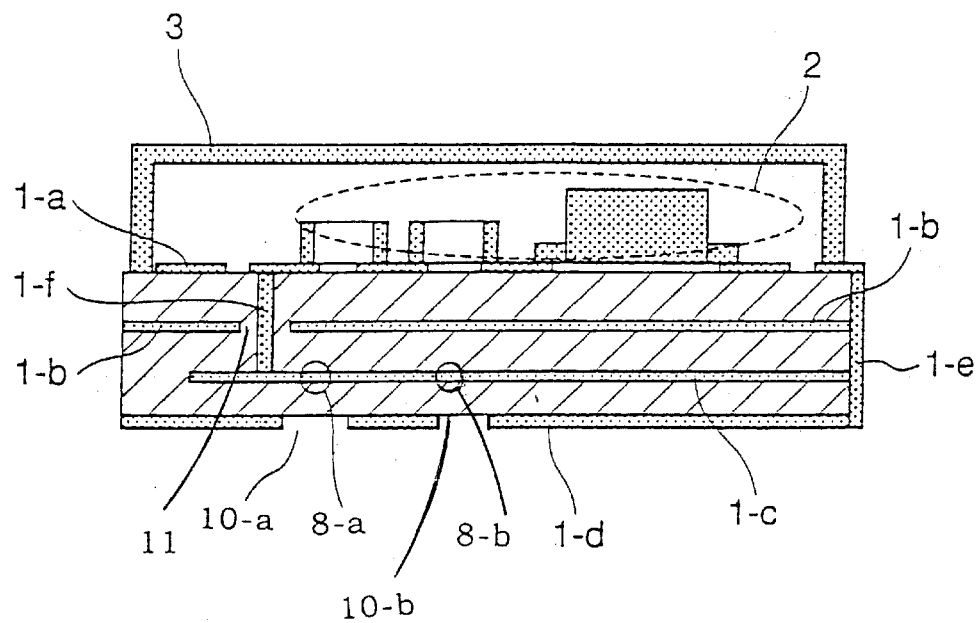
FIG. 2 is a section view of the voltage control oscillator of FIG. 1.

A voltage control oscillator (VCO) having an internal conductor pattern (an inductor element) is shown in a partially exploded perspective view in FIG. 1 as a first preferred embodiment of the present invention. FIG. 2 is a section view of the same.

In the oscillator module according to Embodiment 1 shown in FIG. 1 and FIG. 2, oscillation circuit components are mounted on a front surface of a circuit board 1 including dielectric layers therein, a back conductor 1-d is formed on a back surface of the circuit board so as to cover most of the back surface, and an internal conductor 1-*c,* which is at least a part of an inductor element of the oscillation circuit, is disposed in the circuit board via a part of the dielectric layer from the back conductor 1-*d.* Further, two or more slits or pin holes 10 are formed on the back conductor 1-*d,* through which a laser beam is passed to partially cut the dielectric layer together with the internal conductor 1-*c* at plural sites for adjustment of the oscillation characteristic.

More specifically, this voltage controlled oscillator (VCO) module M comprises surface mounted components 2 of the oscillation circuit including chip resistors, chip capacitors, transistors, variable capacitor diodes and the like mounted by reflow soldering on the surface of a glass-reinforced epoxy resin copper printed circuit board 1 and covered by a shield cap 3 made from shaped metal sheet.

The printed circuit board 1 is a four-layered circuit board including a front conductor pattern surface (layer) 1-*a* to which the surface mounted components are mounted, and an internal strip line conductor pattern layer 1-*c* disposed between an internal ground conductor layer 1-*b* and a back ground conductor layer (a back conductor) 1-*d* to form a tri-plate structure. The thickness of each of the conductor pattern layers is approximately 10 µm to 30 µm. The substrate (a dielectric layer of glass epoxy) between the front conductor pattern surface 1-*a* and the internal ground conductor layer 1-*b* and, the substrate between the internal conductor pattern layer 1-*c* and the back ground conductor layer 1-*d* are each approximately 150 µm thick. The substrate (a dielectric layer of glass epoxy) between the internal ground conductor layer 1-*b* and the internal conductor pattern layer 1-*c* is approximately 200 µm.

One end of the internal conductor pattern layer 1-*c* is disposed at a side of the circuit board, and is grounded by means of a conductor 1-*e* disposed to the inside wall of a notch (half a through-hole) connecting the conductor pattern surface 1-*a,* internal ground conductor layer 1-*b* and back ground conductor layer 1-*d.* The other end of the internal conductor pattern layer 1-*c* is electrically connected by means of a via member 1-*f* to the conductor pattern surface 1-*a* through the middle of a window 11 disposed by cutting away a part of the internal ground conductor layer 1-*b* thereabove.

In addition to the above connections, a Vcc terminal 4, a control terminal 5, and a RF output terminal 6 on the conductor pattern surface 1-*a* are wired to the circuit board back surface by way of conductors 1-*g,* 1-*h,* and 1-*i* disposed to the inside wall of notches (half through holes) in the circuit board side, respectively.

Figure 3:
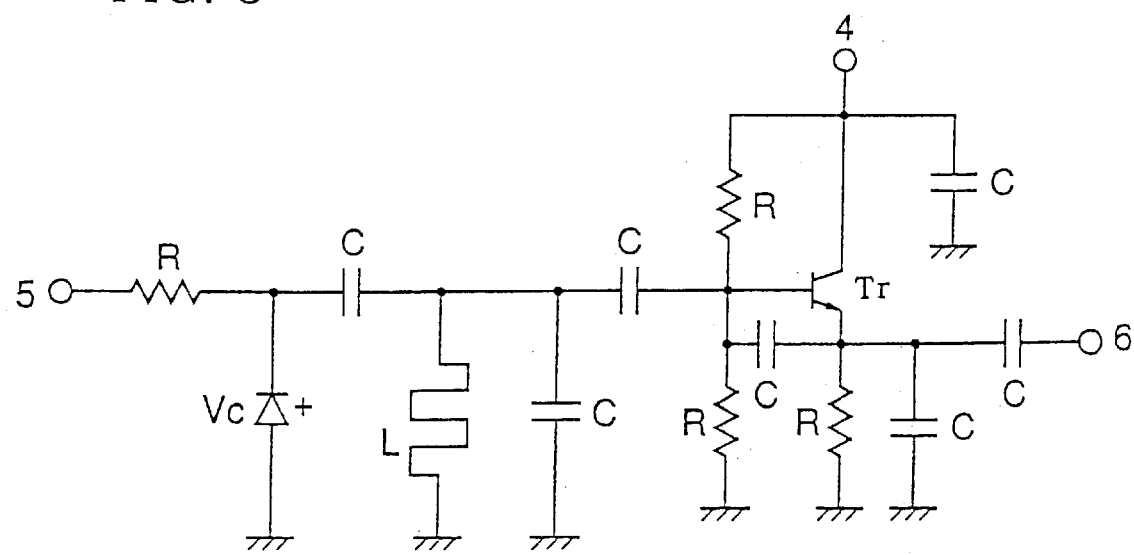
FIG. 3 is a circuit diagram of the voltage control oscillator of FIG. 1.

FIG. 3 is a circuit diagram of this VCO module M.

A transistor Tr, a resistor R, a variable capacitance diode Vc, and a capacitor C in the VCO module M shown in FIG. 3 are surface mounted components 2 mounted on the surface of the above-noted printed circuit board 1. An inductor L of the oscillation circuit is achieved primarily by the internal strip line conductor pattern layer 1-*c* disposed as a part of the tri-plate structure inside the circuit board.

This VCO module M changes the capacitance of the variable capacitance diode Vc, and changes the oscillation frequency of a RF signal obtained from RF output terminal 6, by controlling a voltage applied to the control terminal 5 shown in FIG. 3.

However, the oscillation frequency of each individual module varies as a result of differences in characteristics of individual circuit elements, variations in printed circuit board dimensions, and variations in physical conditions when components are mounted. Therefore, to enable the variable capacitance diode to achieve the desired oscillation frequency range by applying a specific control voltage, the inductance L of the inductor L disposed as the inductor element of the oscillation circuit is adjusted for each module during the module manufacturing process.

The inductance L of the inductor L is adjusted by adjusting the length and width of the internal conductor pattern layer 1-*c* which constitutes the inductor L.

Figure 4:
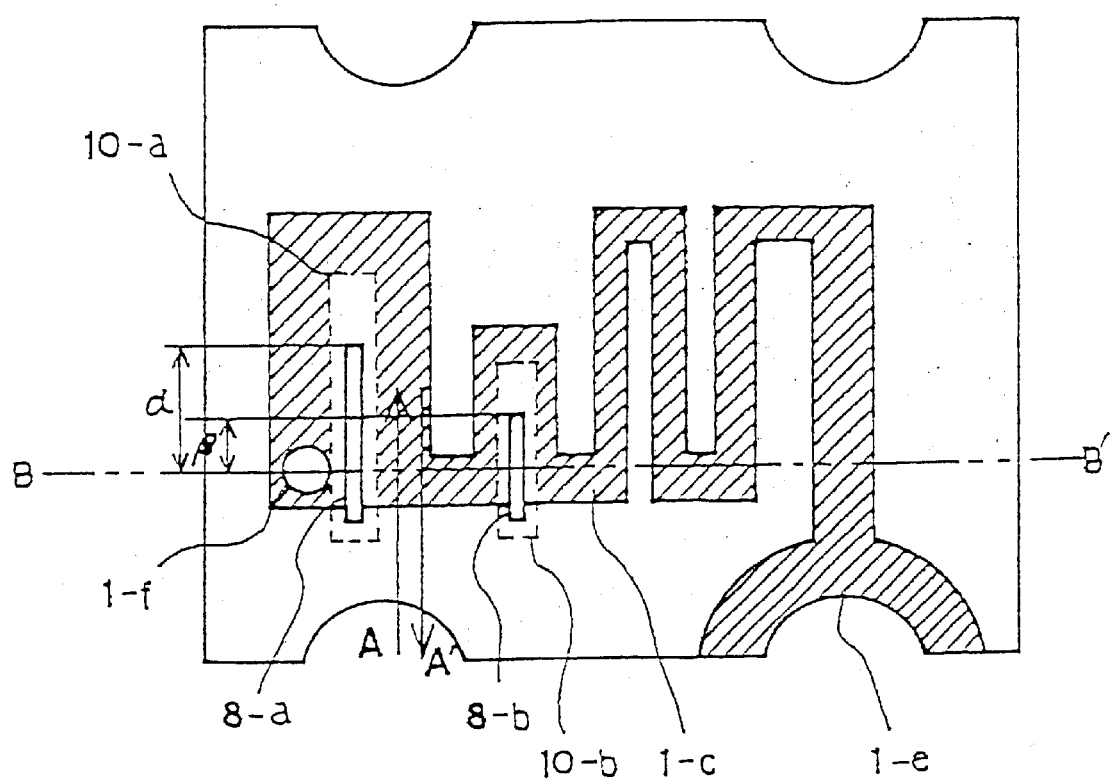
FIG. 4 is a plan view of an internal conductor pattern layer in a printed circuit board used for the voltage control oscillator of FIG. 1.

FIG. 4 is a plan view of the internal conductor pattern layer 1-*c* in the oscillator according to Embodiment 1 of the present invention observed from the front surface side of the VCO module M. Note that the conductor 1-*e* side of the circuit board notch is grounded by way of the circuit board side, and the internal conductor pattern layer 1-*c* is connected to other oscillator components 2 mounted on the circuit board surface by way of the via member 1-*f.*

This conductor is trimmed at parts 8-*a* and 8-*b* shown in FIG. 4. Accordingly, the electrical length of this conductor can be increased by approximately 2α and 2β at the parts 8-*a* and 8-*b,* respectively, and the conductor width can also be decreased. That is, this conductor has two parts of the internal conductor pattern a part of the internal conductor pattern around the trimming part 8-*a* and a part of the internal conductor pattern around the trimming part 8-*b* in which the oscillation characteristic can be continuously varied depending on the trimming amount.

The inductance L of an inductor comprising a parallel grounded conductor of a distributed constant high frequency circuit can be increased by increasing the electrical length or reducing the width of the inductor. In this embodiment of the invention, therefore, the initial oscillation frequency of the module is set to a level higher than the desired frequency. The inductor is then trimmed at the parts 8-*a* and 8-*b* shown in FIG. 4 to greatly change the inductance L of the inductor of the oscillator and lower the oscillation frequency, thereby adjusting the module to the desired oscillation frequency.

In this embodiment of the invention, the trimming part 8-*a* has a width of approximately several ten micrometers and a length of 0 to 1 mm, and the trimming part 8-*b* has a width of approximately several ten micrometers and a length of 0 to 0.5 mm.

Figure 5:
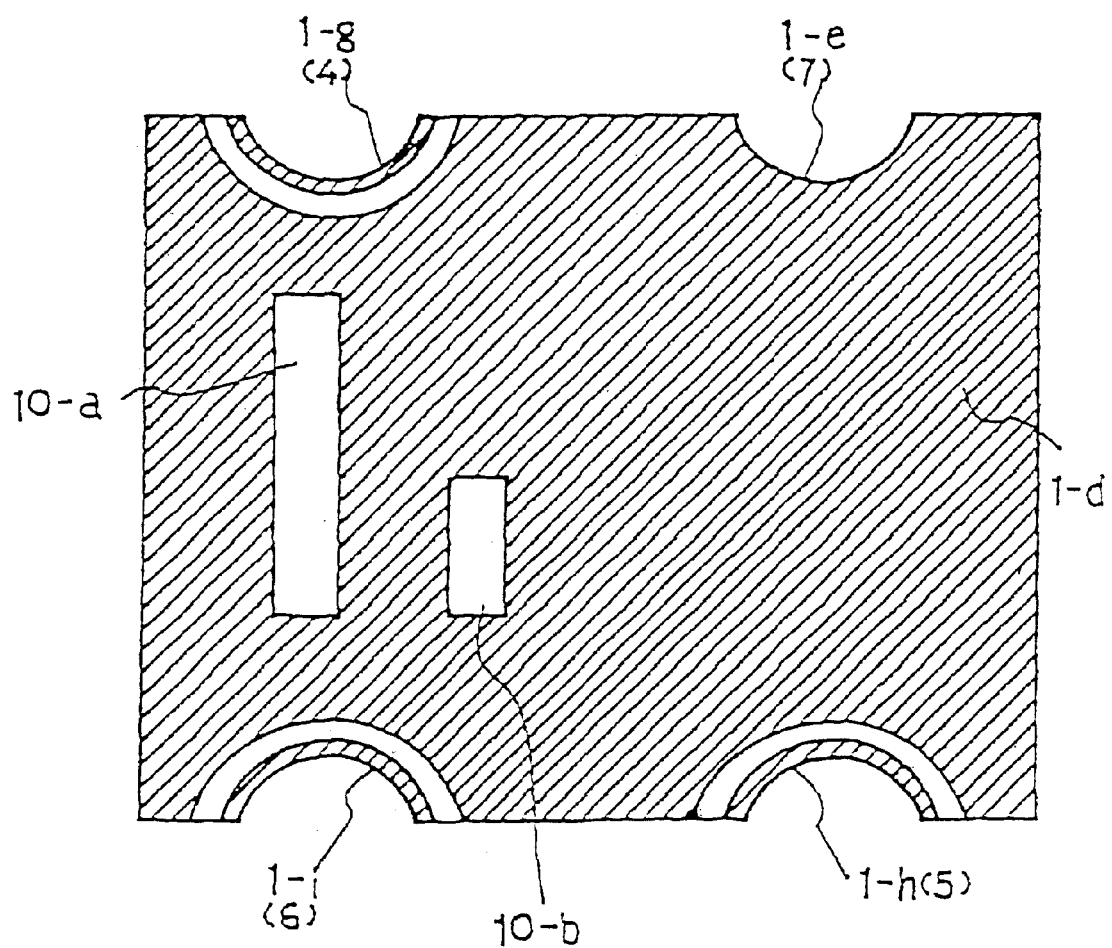
FIG. 5 is a bottom view of the printed circuit board of FIG. 4.

FIG. 5 is a plan view of this VCO module M according to Embodiment 1 observed from the back surface. Except for the Vcc terminal 4, control terminal 5, RF output terminal 6 and dielectric bands 9 surrounding the terminals, the major part of the back surface is covered with the ground conductor layer 1-*d.* The ground conductor layer 1-*d* is provided with a trimming slit 10-*a* of 150 µm wide and 1 mm long and a trimming slit 10-*b* of 150 µm wide and 0.5 mm long are formed so as to overlap with the trimming parts 8-*a* and 8-*b* of the internal conductor pattern layer 1-*c,* respectively.

Figure 6:
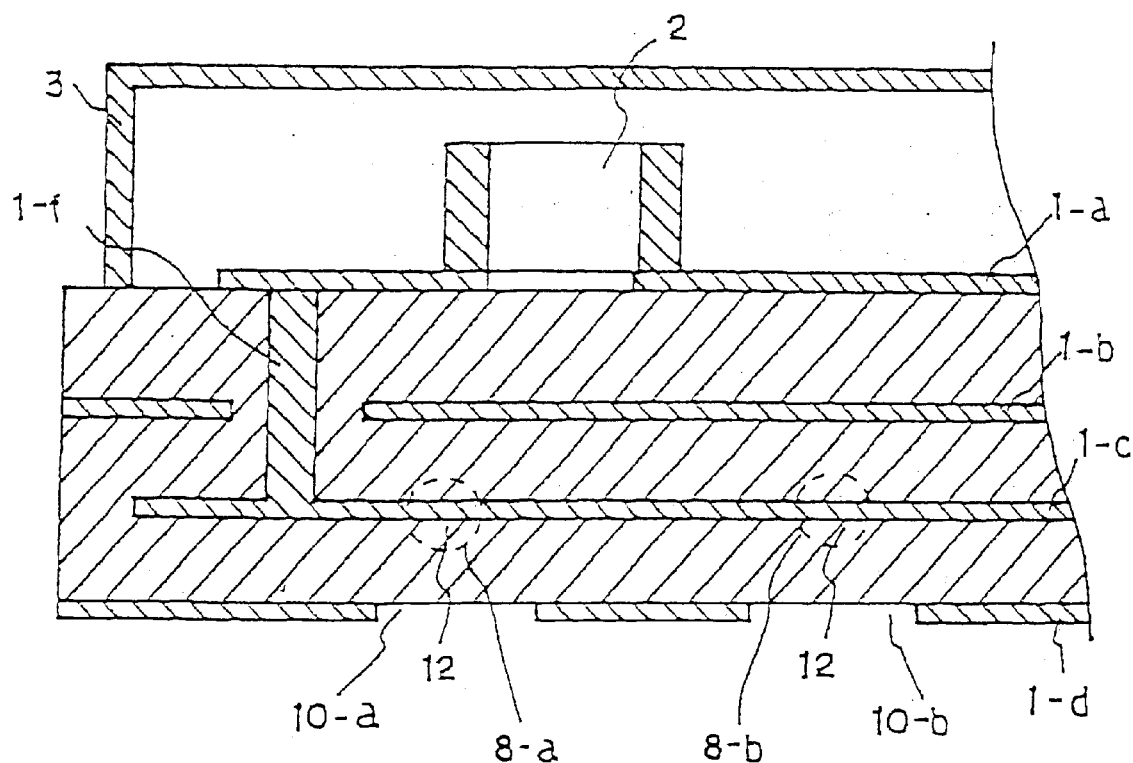
FIG. 6 is a section view of a trimming target area of the printed circuit board in accordance with Embodiment 1 of the present invention.

FIG. 6 is an enlarged section view of the trimming parts taken along a double-dot dashed line B–B' in FIG. 4. A laser beam 12 is irradiated through the trimming slits 10-*a* and 10-*b* to cut the dielectric layer located between the internal conductor pattern layer 1-*c* and the slits and the internal conductor pattern layer 1-*c* separately. Power of the laser beam 12 is suitably controlled to a level at which only the dielectric layer and the internal conductor pattern layer 1-*c* are cut.

The trimming as described above is accomplished by laser irradiation to the back side of the module as shown in FIG. 6 after the module is completely assembled. More specifically, probes are held to each terminal of the module to monitor the actual oscillation frequency and then the trimming is carried out while driving the module. In each of the trimming slits 10-*a* and 10-*b,* the laser beam is shifted in the direction of arrow A through the full length of the slit to trim the dielectric layer. At this time, the power of the laser beam is controlled to a level at which only the dielectric layer is trimmed.

After the laser beam is once shifted through the full length of the slit, the laser beam is then moved in a substantially perpendicular direction to the direction of the arrow A by a distance smaller than a spot diameter of the laser beam and shifted back in a direction of A' shown in FIG. 4 through the full length of the slit to further trim the dielectric layer. Thus, a certain width of the dielectric layer is trimmed. By scanning the laser beam in plural times, the internal conductor pattern layer 1-c to be trimmed next is exposed.

Thereafter, in each of the slits 10-a and 10-b, the laser beam is shifted in the arrow A direction shown in FIG. 4 to trim the internal conductor pattern layer 1-c while monitoring the oscillation frequency. At this time, the power of the laser beam is controlled to a level at which only the internal conductor pattern layer 1-c is trimmed.

Even in the case where the desired characteristics are obtained by trimming the internal conductor pattern layer 1-c through the full length of the slits 10-a and 10-b, the laser beam is stopped at a ⅔ length of the slit and moved in a substantially perpendicular direction to the arrow A direction by a distance smaller than a spot diameter of the laser beam and then shifted back in the arrow A' direction shown in FIG. 4 through the ⅔ length of the slit to further trim the dielectric layer. Then, the laser beam is shifted again in the arrow A direction shown in FIG. 4 to increase the trimming length while monitoring the oscillation frequency. When the desired oscillation frequency is obtained, the laser beam is moved in a substantially perpendicular direction to the arrow A direction by a distance smaller than a spot diameter of the laser beam and then shifted back in the direction of arrow A' shown in FIG. 4 to trim through the increased length.

The frequency is hardly changed even if the laser beam is shifted back after the desired oscillation frequency is obtained. Thus, the internal conductor pattern is surely trimmed with a certain width.

According to the plural scanning of the laser beam with respect to the internal conductor pattern layer 1-c, high precision adjustment to obtain the desired oscillation frequency is carried out.

Since the shield cap 3 is attached to the module before the trimming, no consideration is required for a shift in operating characteristics such as the oscillation frequency resulting from covering the module with a shield cap after oscillator adjustment.

Embodiment 2

Figure 7:
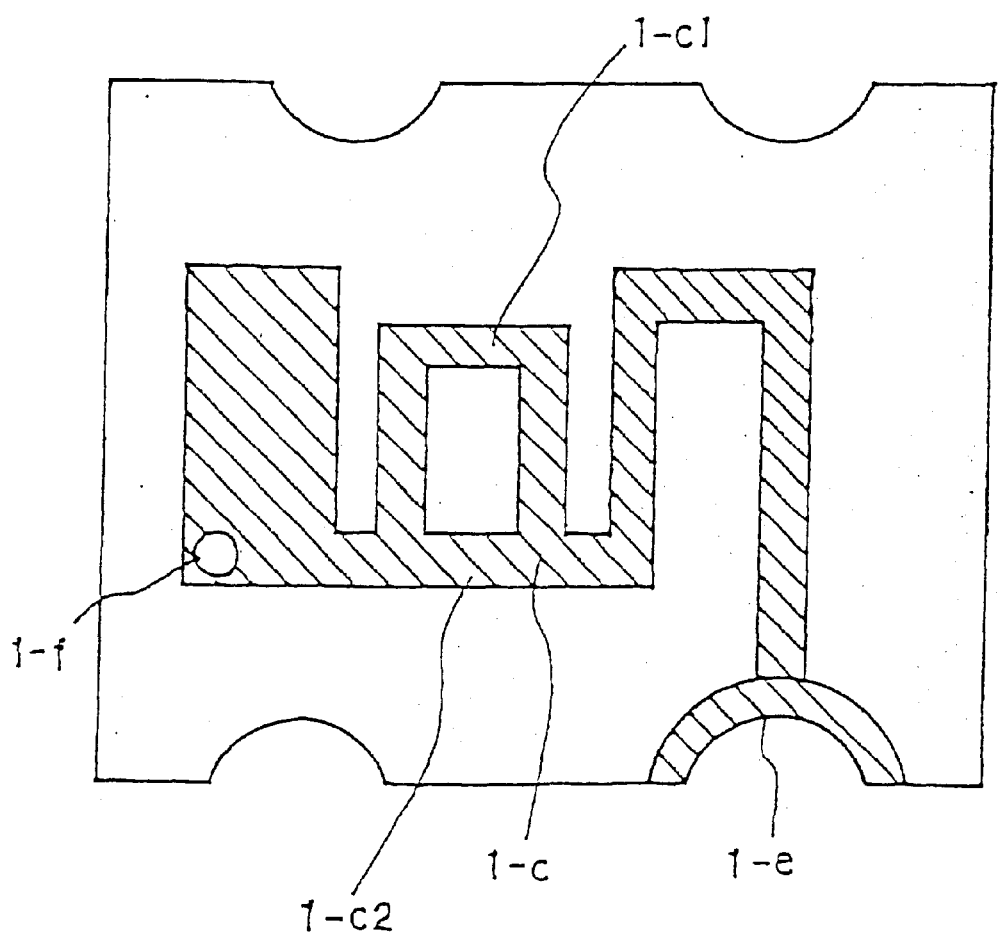
FIG. 7 is a plan view of an internal conductor pattern layer in a printed circuit board in accordance with Embodiment 2 of the present invention.
Figure 8:
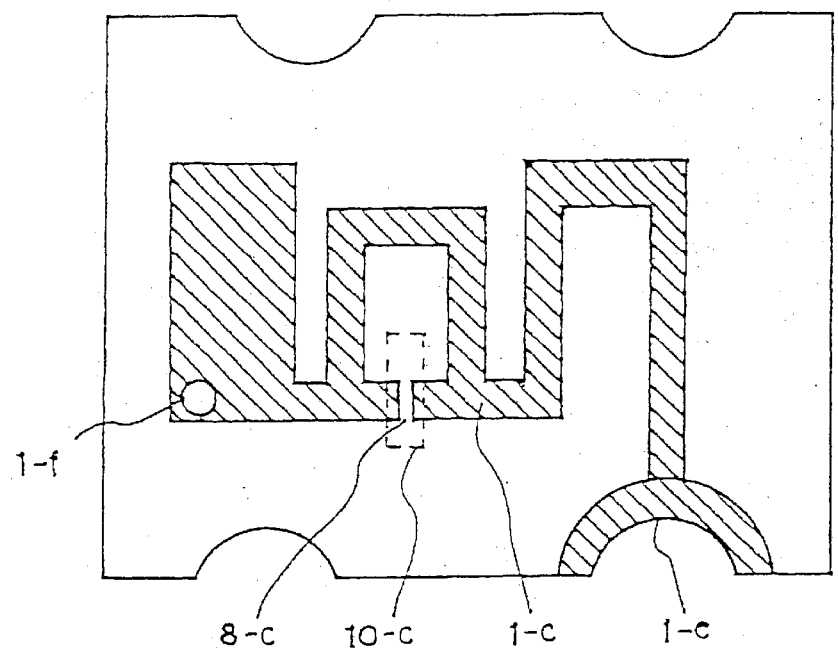
FIG. 8 a plan view of the internal conductor pattern layer in the printed circuit board in accordance with Embodiment 2 of the present invention.

The above-mentioned Embodiment 1 explained the internal conductor pattern layer 1-c including trimming parts which allow the oscillation characteristic to be continuously varied depending on which part is cut. Embodiment 2 will describe the internal conductor pattern layer 1-c provided with an internal strip line including a detour path and a short path for shorting both ends of the detour path as shown in FIGS. 7 and 8. Since Embodiment 2 is basically the same as Embodiment 1, only a different feature will be described below.

FIGS. 7 and 8 are plan views of the internal conductor pattern layer 1-c of the module M according to Embodiment 2. These figures correspond to FIG. 4 of Embodiment 1. As shown in FIGS. 7 and 8, a conductor 1-e side of the internal conductor pattern layer 1-c in the circuit board notch is grounded by way of the circuit board side and connected through a via member 1-f to other oscillator components 2 mounted on the circuit board surface.

The internal conductor pattern layer 1-c includes a detour path 1-c1 and a short path 1-c2. Where the short path 1-c2 is not trimmed as shown in FIG. 7, the short path 1-c2 intervenes the electrical length of the internal conductor pattern layer 1-c.

Where the short path 1-c2 of FIG. 7 is trimmed at a trimming part 8-c as shown in FIG. 8, the detour path 1-c1 intervenes the electrical length of the internal conductor pattern layer 1-c. The trimming of the short path 1-c2 is carried out by laser beam irradiation as performed in Embodiment 1.

According to Embodiment 2, the electrical length of the internal conductor pattern layer 1-c can be greatly varied in steps because the electrical length passing through the short path 1-c2 is employed if it is not trimmed, and the electrical length passing through the detour path 1-c1 is employed if the short path is trimmed.

A slit 10-c shown in FIG. 8 corresponds to the slits 10-a and 10-b shown in FIG. 4 of Embodiment 1.

In this embodiment, the detour path and the short path in a pair are described. However, it may be possible to provide the detour paths and the short paths in plural pairs in which the detour paths have different lengths so that more fine electrical length adjustment can be done.

Embodiment 3

Figure 9:
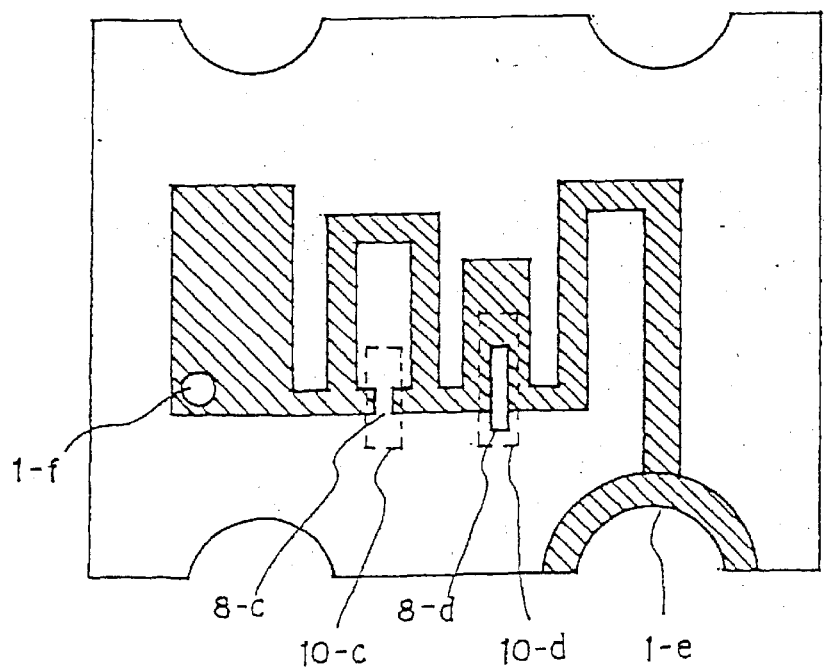
FIG. 9 is a plan view of an internal conductor pattern layer in a printed circuit board in accordance with Embodiment 3 of the present invention.
Figure 10:
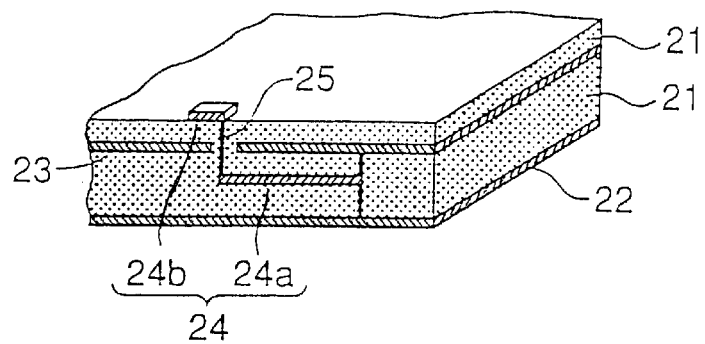
FIG. 10 is a view illustrating a structure of a conventional oscillator.
Figure 11:
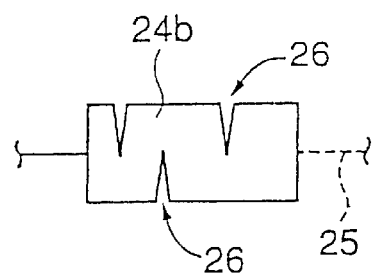
FIG. 11 is a view illustrating a trimming target area of an electrode of the oscillator of FIG. 10.
Figure 12:
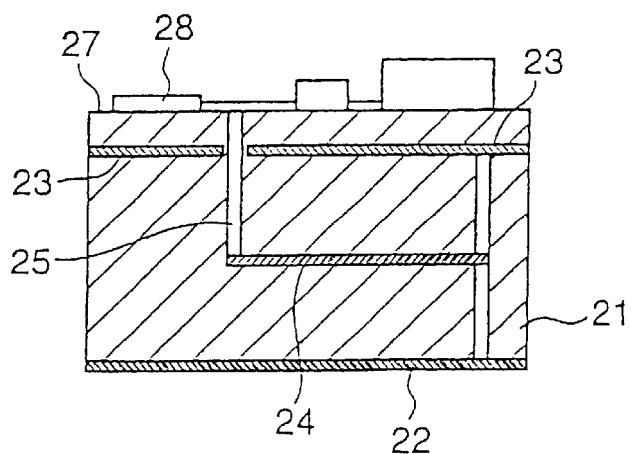
FIG. 12 is a view illustrating a structure of a conventional oscillator.
Figure 13:
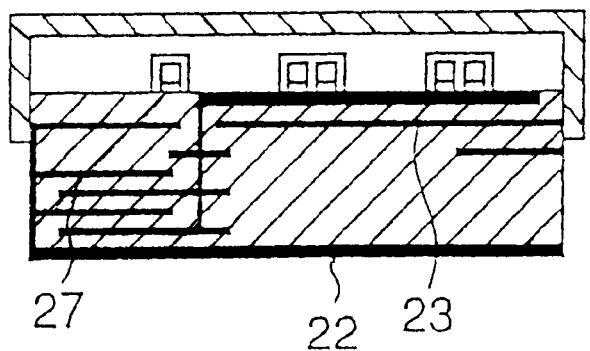
FIG. 13 is a view illustrating a structure of a conventional oscillator.
Figure 14:
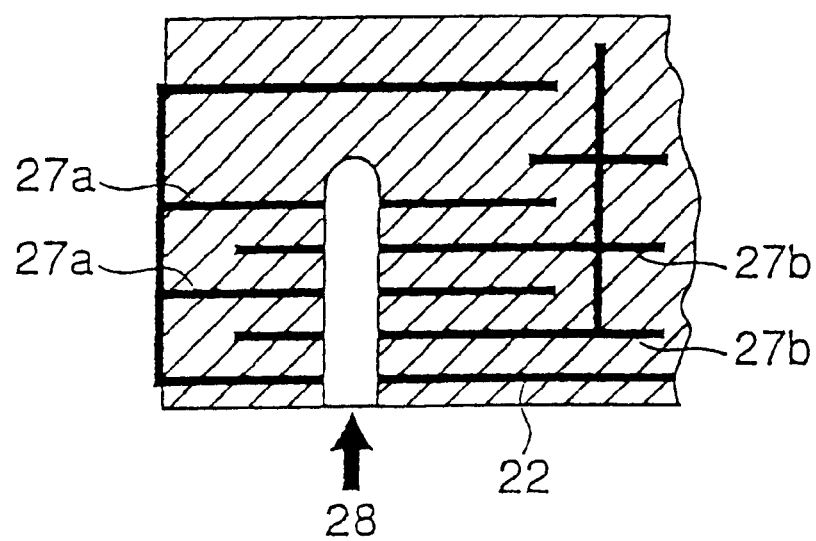
FIG. 14 is a view illustrating a trimming target area of an electrode of the oscillator of FIG. 13.
Figure 15:
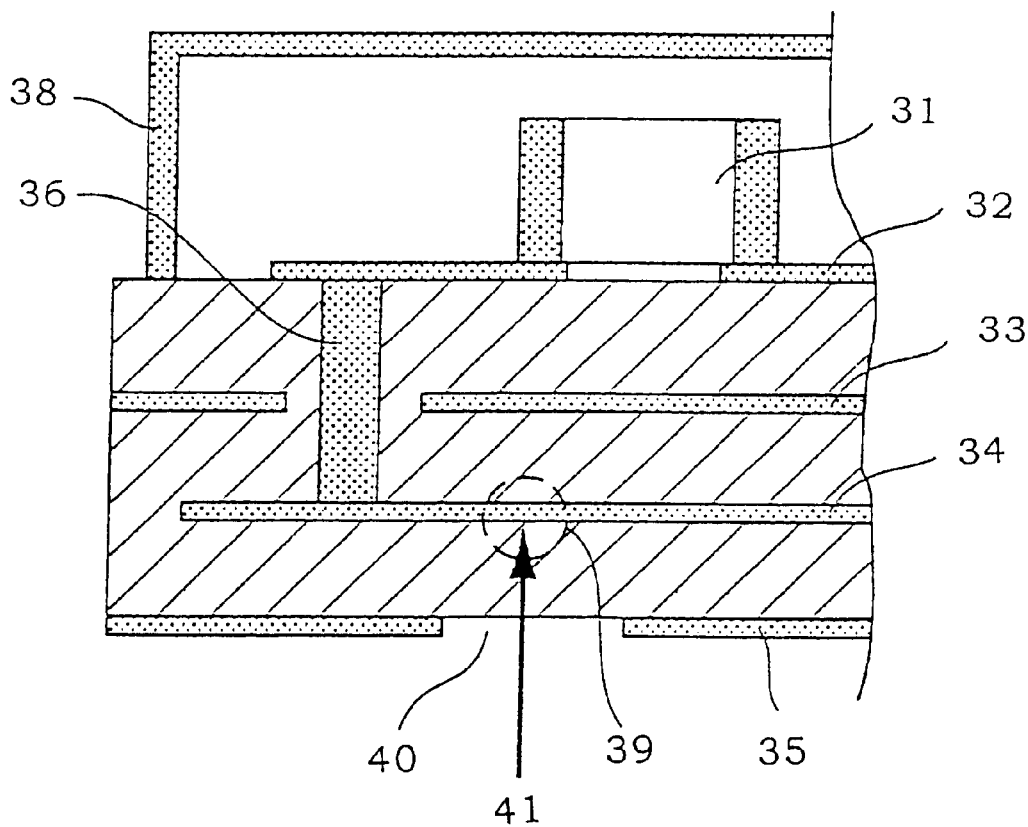
FIG. 15 is a section view of a trimming target area of an oscillator in accordance with the preceding invention.

Referring to FIG. 9, explanation is given to an oscillator of Embodiment 3 wherein the internal conductor pattern layer 1-c of Embodiment 2 is added with a part which allows the oscillation characteristic to be continuously varied depending on which part is cut.

FIG. 9 is a plan view of the internal conductor pattern layer 1-c of the module M of Embodiment 3 observed from the front surface of the module. This figure corresponds to FIG. 4 of Embodiment 1 and FIGS. 7 and 8 of Embodiment 2.

Similar to Embodiment 2, a conductor 1-e side of the internal conductor pattern layer 1-c in the circuit board notch is grounded by way of the circuit board side and connected through a via member 1-f to other oscillator components 2 mounted on the circuit board surface as shown in FIG. 9.

According to Embodiment 3, where the frequency needs to be greatly changed to reach the desired frequency, the short path 1-c2 of the internal conductor pattern layer is trimmed first at the trimming part 8-c to perform rough adjustment, and then another part of the internal conductor pattern layer is trimmed at another trimming part 8-d to perform fine adjustment. Thus, the desired frequency is obtained. If the trimming of the short path 1-c2 results in a frequency lower than the desired frequency, the trimming may be carried out only at the trimming part 8-d for adjustment to the desired frequency.

In order to perform the rough and fine adjustments described above, it is necessary to design the internal conductor pattern layer 1-c such that the frequency range varied by the trimming at the trimming part 8-d becomes greater than the frequency range varied by the trimming at the short path 1-c2 (the detour path 1-c1 intervenes the electrical length of the internal conductor pattern layer 1-c). That is, the variation amount of the inductance L which is continuously varied depending on the trimming amount of the internal conductor pattern layer 1-c is greater than the variation amount of the inductance L caused by the trimming of the short path 1-c2. Accordingly, the inductance L can be adjusted to every value in the adjustment range, i.e., fine adjustment and rough adjustment within the entire adjustment range is allowed.

Slits 10-c and 10-d shown in FIG. 9 correspond to the slits 10-a and 10-b explained in Embodiment 1 and FIG. 4, respectively.

In Embodiments 1–3, pinholes may be formed in place of the slits.

Further, according to Embodiments 1–3, the trimming is carried out by using a trimming device capable of simultaneously contacting prove pins to electrodes of plural oscillators formed on the same plane of a substrate for electrical connection, selecting an oscillator whose characteristic is to be adjusted by energizing it and electrically switching a frequency measuring circuit. Further, the trimming device is also capable of positioning the laser beam to the slit or pinhole of any of the electrically connected oscillators by means of optical scanning method. Therefore, the trimming for adjustment of a large number of oscillators is carried out to in a shorter period as compared with a process of mechanically aligning the oscillators one by one on a trimming stage for trimming.

According to the present invention, the internally disposed inductor element is partially cut (trimmed) at plural sites by the laser beam passing through the slits or pinholes together with the dielectric layer between the back conductor and the internal conductor (a part of the internally disposed inductor element), so that the electrical length of the internally disposed conductor layer is changed and the oscillation characteristic is adjusted. This prevents the width of a certain part of the inductor element from being extremely reduced and thus prevents decrease of Q value of the inductance L.

Since the short path forming a pair with the detour path of the internal strip line of the inductor element is trimmed, the electrical length of the inductor element can be greatly varied in steps regardless of the length of the trimmed part. Thus, where a great change of the inductance L is required to obtain the desired oscillation characteristics, it is achieved with a shorter trimming time.

Sometimes it may be impossible to cut the dielectric layer or at least a part of the internally disposed inductor element by scanning the laser beam only once. However, according to the present invention, the laser beam is scanned repeatedly so that the trimming is surely carried out, which improves reliability of the oscillator module.

Still according to the present invention, the dielectric layer is trimmed by the first laser beam irradiation to expose the internal conductor layer (a part of the internally disposed inductor element) and then the internal conductor layer is trimmed by the second laser beam irradiation at the same position as the first laser beam irradiation. Accordingly, power of the laser beam is easily adjusted to the optimum level for the dielectric layer and the internally disposed inductor element, respectively, so that the dielectric layer and the internally disposed inductor element can be trimmed and cut more accurately than the simultaneous trimming of them. Therefore, the reliability of the oscillation module itself improves.

What is claimed is:

1. An oscillator comprising:
    a circuit board having a dielectric layer therein;
    an oscillator circuit comprising its components and an inductor element, the components being mounted on a front surface of the circuit board and at least a part of the inductor element being internally disposed in the dielectric layer; and
    a back conductor provided on a back surface of the circuit board;
    wherein the back conductor has two or more slits or pinholes through which a laser beam is passed for partially cutting the dielectric layer together with the internally disposed inductor element at plural sites for adjustment of an oscillation characteristic and
    wherein the inductor element comprises an internally disposed strip line including a detour path and a short path for shorting both ends of the detour path, the short path being cut by the laser beam in at least one site of the plural sites.

2. An oscillator according to claim 1, wherein the inductor element further includes an internally disposed conductor pattern to be cut by the laser beam in at least one site of the plural sites in addition to the short path, the internally disposed conductor pattern allowing the oscillation characteristic to be continuously varied depending on which part is cut.

3. An oscillator according to claim 2, wherein a variation amount of the oscillation characteristic caused by cutting the internally disposed conductor pattern which allows the oscillation characteristic to be continuously varied depending on which part is cut is greater than a variation amount of the oscillation characteristic caused by cutting the short path.

4. An oscillator comprising:
    a circuit board having a dielectric layer therein;
    an oscillator circuit comprising its components and an inductor element, the components being mounted on a front surface of the circuit board and at least a part of the inductor element being internally disposed in the dielectric layer; and
    a back conductor provided on a back surface of the circuit board;
    wherein the back conductor has two or more slits or pinholes through which a laser beam is passed for partially cutting the dielectric layer together with the internally disposed inductor element at plural sites for adjustment of an oscillation characteristic,
    the inductor element comprises an internally disposed strip line including a detour path and a short path for shorting both ends of the detour path, and
    the short path is cut by the laser beam passing through the slits or pinholes to adjust the oscillation characteristic.

5. A method for adjusting an oscillation characteristic of an oscillator comprising a circuit board having a dielectric layer therein; an oscillator circuit comprising its components and an inductor element, the components being mounted on a front surface of the circuit board and at least a part of the inductor element being internally disposed in the dielectric layer; and a back conductor being provided on a back surface of the circuit board,
    wherein the oscillation characteristic is adjusted by partially cutting the dielectric layer and the internally disposed part of the inductor element at plural sites with a laser beam passing through two or more slits or pinholes formed on the back conductor and
    wherein an internally disposed strip line including a detour path and a short path for shorting both ends of the detour path is provided as the inductor element, and the oscillation characteristic is adjusted by cutting the short path with the laser beam in at least one site of the plural sites.

6. A method according to claim 5, wherein an internally disposed conductor pattern which allows the oscillation characteristic to be continuously varied depending on which part is cut is provided in the inductor element, and the oscillation characteristic is adjusted by cutting the internally disposed conductor pattern with the laser beam in at least one site of the plural sites.

7. A method according to claim 6, wherein a variation amount of the oscillation characteristic caused by cutting the internally disposed conductor pattern which allows the oscillation characteristic to be continuously varied depending on which part is cut is greater than a variation amount of the oscillation characteristic caused by cutting the short path.

8. A method for adjusting an oscillation characteristic of an oscillator comprising a circuit board having a dielectric layer therein; an oscillator circuit comprising its components and an inductor element, the components being mounted on a front surface of the circuit board and at least a part of the inductor element being internally disposed in the dielectric layer; and a back conductor being provided on a back surface of the circuit board, wherein an internally disposed inductor element including a detour path and a short path for shorting both ends of the detour path is provided as the inductor element and the oscillation characteristic is adjusted by cutting the dielectric layer and the short path with a laser beam passing through two or more slits or pinholes formed on the back conductor.

9. A method for adjusting an oscillation characteristic of an oscillator comprising a circuit board having a dielectric layer therein; an oscillator circuit comprising its components and an inductor element, the components being mounted on a front surface of the circuit board and at least a part of the inductor element being internally disposed in the dielectric layer; and a back conductor being provided on a back surface of the circuit board, wherein the oscillation characteristic is adjusted by partially cutting the internally disposed inductor element with a laser beam scanning repeatedly through two or more slits or pinholes formed in the back conductor while shifting it by a distance smaller than a spot diameter of the laser beam in a substantially perpendicular direction to the scanning direction.

10. A method for adjusting an oscillation characteristic of an oscillator comprising a circuit board having a dielectric layer therein; an oscillator circuit comprising its components and an inductor element, the components being mounted on a front surface of the circuit board and at least a part of the inductor element being internally disposed in the dielectric layer; and a back conductor being provided on a back surface of the circuit board, wherein the oscillation characteristic is adjusted by cutting the dielectric layer with a first laser beam and then cutting at least a part of the internally disposed inductor element with a second laser beam, the first and second laser beam passing through two or more slits or pinholes formed on the back conductor.

11. A method according to claim 10, wherein at least one of the first and second laser beams is scanned repeatedly while shifting it by a distance smaller than a spot diameter of the laser beam in a substantially perpendicular direction to the scanning direction.

* * * * *